United States Patent
Kim et al.

(10) Patent No.: US 7,859,086 B2
(45) Date of Patent: Dec. 28, 2010

(54) NITRIDE SEMICONDUCTOR SINGLE CRYSTAL SUBSTRATE, AND METHODS OF FABRICATING THE SAME AND A VERTICAL NITRIDE SEMICONDUCTOR LIGHT EMITTING DIODE USING THE SAME

(75) Inventors: Cheol Kyu Kim, Seoul (KR); Yung Ho Ryu, Seoul (KR); Soo Min Lee, Seoul (KR); Jong In Yang, Gyunggi-do (KR); Tae Hyung Kim, Seoul (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 293 days.

(21) Appl. No.: 11/723,065

(22) Filed: Mar. 16, 2007

(65) Prior Publication Data

US 2007/0215983 A1    Sep. 20, 2007

(30) Foreign Application Priority Data

Mar. 17, 2006 (KR) .................. 10-2006-0024918

(51) Int. Cl.
*H01L 33/00* (2010.01)
*H01L 29/04* (2010.01)
*H01L 29/12* (2010.01)

(52) U.S. Cl. .............. 257/627; 257/101; 257/103; 257/E21.09; 257/E21.461; 257/E33.028

(58) Field of Classification Search .......... 257/101, 257/103, 627, E21.09, E21.461, E33.028
See application file for complete search history.

(56) References Cited

U.S. PATENT DOCUMENTS 5,059,545 A * 10/1991 Frensley et al. .............. 438/312
6,153,010 A * 11/2000 Kiyoku et al. ................. 117/95

(Continued)

FOREIGN PATENT DOCUMENTS

JP          10-229218          8/1998

(Continued)

OTHER PUBLICATIONS

Japanese Office Action, with English translation, issued in Japanese Patent Application No. 2007-069541, dated May 18, 2010.

*Primary Examiner*—Leonardo Andújar
*Assistant Examiner*—Teresa M. Arroyo
(74) *Attorney, Agent, or Firm*—McDermott Will & Emery LLP

(57) ABSTRACT

A nitride semiconductor single crystal substrate, a manufacturing method thereof and a method for manufacturing a vertical nitride semiconductor device using the same. According to an aspect of the invention, in the nitride semiconductor single crystal substrate, upper and lower regions are divided along a thickness direction, the nitride single crystal substrate having a thickness of at least 100 μm. Here, the upper region has a doping concentration that is five times or greater than that of the lower region. Preferably, a top surface of the substrate in the upper region has Ga polarity. Also, according to a specific embodiment of the invention, the lower region is intentionally un-doped and the upper region is n-doped. Preferably, each of the upper and lower regions has a doping concentration substantially identical in a thickness direction.

7 Claims, 4 Drawing Sheets

U.S. PATENT DOCUMENTS

| | | | |
|---|---|---|---|
| 6,320,207 B1* | 11/2001 | Furukawa et al. | 257/101 |
| 6,455,877 B1* | 9/2002 | Ogawa et al. | 257/99 |
| 6,586,777 B1* | 7/2003 | Yuasa et al. | 257/103 |
| 7,105,857 B2* | 9/2006 | Nagahama et al. | 257/86 |
| 7,442,569 B2* | 10/2008 | Lee et al. | 438/47 |
| 7,504,274 B2* | 3/2009 | Chakraborty et al. | 438/46 |
| 7,649,194 B2* | 1/2010 | Yoshida | 257/13 |
| 2005/0184299 A1* | 8/2005 | Matsumura et al. | 257/79 |
| 2006/0186397 A1* | 8/2006 | Ghyselen et al. | 257/11 |
| 2006/0257626 A1* | 11/2006 | Schlesser et al. | 428/141 |
| 2007/0141814 A1* | 6/2007 | Leibiger et al. | 438/483 |
| 2008/0073652 A1* | 3/2008 | Sugimoto et al. | 257/76 |
| 2008/0128706 A1* | 6/2008 | Fujiwara et al. | 257/76 |
| 2008/0311393 A1* | 12/2008 | Dwilinski et al. | 428/337 |
| 2009/0039373 A1* | 2/2009 | Saito et al. | 257/98 |
| 2009/0101935 A1* | 4/2009 | Sugawara | 257/103 |
| 2009/0155987 A1* | 6/2009 | Lee | 438/478 |

FOREIGN PATENT DOCUMENTS

| | | |
|---|---|---|
| JP | 11-340571 | 12/1999 |
| JP | 2001-148533 | 5/2001 |
| JP | 2005-268769 | 5/2005 |
| JP | 2007-070154 | 3/2007 |

* cited by examiner (a)

(b)

Leser beam   Moving direction

NITRIDE SEMICONDUCTOR SINGLE CRYSTAL SUBSTRATE, AND METHODS OF FABRICATING THE SAME AND A VERTICAL NITRIDE SEMICONDUCTOR LIGHT EMITTING DIODE USING THE SAME

CLAIM OF PRIORITY

This application claims the benefit of Korean Patent Application No. 2006-24918 filed on Mar. 17, 2006 in the Korean Intellectual Property Office, the disclosure of which is incorporated herein by reference.

BACKGROUND OF THE INVENTION

1. Field of the Invention

The present invention relates to a nitride single crystal substrate, and more particularly, to a nitride single crystal substrate capable of facilitating a manufacturing process of a light emitting device and a vertical nitride light emitting device using the same.

2. Description of the Related Art

In general, a group III nitride semiconductor emits a wide range of light from a visible light to an ultraviolet ray. The group III nitride semiconductor has been greatly highlighted as an optical device material for realizing bluish green light.

Typically, a nitride single crystal has been produced on a heterojunction substrate by a vapor growth method such as Metal Organic Vapor Phase Epitaxy (MOVPE), Hydride Vapor Phase Epitaxy (HVPE) or a Molecular Beam Epitaxy (MBE) method. Examples of the heterogeneous substrate include a sapphire ($\alpha$-$Al_2O_3$) substrate or a SiC substrate. But the sapphire substrate has lattice constant mismatch of about 13% with nitride gallium. Also, the sapphire substrate has a considerable difference (−34%) in thermal expansion coefficient with nitride gallium. This causes stress to an interface between the sapphire substrate and a nitride gallium single crystal, thereby resulting in lattice defects and cracks in the single crystal.

In a recent attempt to overcome this problem, the nitride semiconductor device has been directly grown on a homojunction substrate, i.e., a nitride single crystal substrate. As a prerequisite therefor, a technology for fabricating a free-standing nitride single crystal has been vigorously studied.

To produce the free standing nitride single crystal substrate, as shown in FIG. 1a, first, a nitride single crystal bulk 12 is grown on a base substrate 11 such as a sapphire substrate. Then, as shown in FIG. 1b, the base substrate 11 is removed from the nitride single crystal bulk 12. Here, the sapphire substrate is removed by laser lift-off.

The nitride single crystal substrate may be conductive contrary to the sapphire substrate, which thus allows easy manufacture of a vertical light emitting device superior in current spreading efficiency. However, in reality, even with use of the nitride single crystal substrate, there is a difficulty in fabricating the vertical light emitting device.

More specifically, the nitride single crystal substrate needs to be highly doped to be sufficiently conductive. Otherwise, it entails a complicated process since the nitride single crystal substrate should be entirely removed by mechanical polishing to fabricate a vertical light emitting device.

Alternatively, the nitride single crystal substrate may be highly doped with specific impurities to be sufficiently conductive. Yet, higher concentration of impurities in the nitride single crystal increases stress in the single crystal and accordingly defect density, thereby leading to degradation of crystal quality such as decline in carrier mobility. Such doping with specific impurities may inflict cracks on a large-scale substrate which is manufactured.

SUMMARY OF THE INVENTION

The present invention has been made to solve the foregoing problems of the prior art and therefore an aspect of the present invention is to provide a nitride single crystal substrate which assures superior crystallinity and can be suitably applied to manufacture a vertical nitride light emitting device.

Another aspect of the invention is to provide methods for manufacturing the nitride single crystal substrate and a vertical nitride semiconductor device using the same.

According to an aspect of the invention, the invention provides a nitride single crystal substrate including upper and lower regions divided along a thickness direction, the nitride single crystal substrate having a thickness of at least 100 μm, wherein the upper region has a doping concentration that is five times or greater than that of the lower region.

In general, a top surface of the substrate in the upper region has less surface roughness than an underside surface of the substrate in the lower region.

In a specific embodiment of the invention, the lower region is intentionally un-doped and the upper region is n-doped. Preferably, each of the upper and lower regions has a doping concentration substantially identical in a thickness direction. Preferably, the upper region has a doping concentration of at least $5\times10^{18}/cm^3$, and the lower region has a doping concentration up to $5\times10^{17}/cm^3$.

The substrate has a thickness ranging from 200 μm to 600 μm.

The lower region has a thickness ranging from 100 μm to 500 μm. This assures superior crystallinity and simplifies a lapping process. Also, preferably, the upper region has a thickness ranging from 10 μm to 100 μm.

The nitride single crystal substrate comprises a material having a composition expressed by $Al_xIn_yGa_{(1-x-y)}N$, where $0 \leq x \leq 1$, $0 \leq y \leq 1$, and $0 \leq x+y \leq 1$.

According to another aspect of the invention, the invention provides a method for manufacturing a nitride single crystal substrate including:

preparing a base substrate for growing a nitride single crystal;

growing a first nitride single crystal layer on the base substrate;

growing a second nitride single crystal layer on the first nitride single crystal layer, the second nitride single crystal layer having a doping concentration that is five times or greater than that of the first nitride single crystal layer; and removing the base substrate to obtain a nitride single crystal substrate having first and second nitride single crystal layers, wherein the nitride single crystal substrate has a thickness of at least 100 μm.

Preferably, the first and second nitride single crystal layers are grown by Hydride Vapor Phase Epitaxy which ensures high speed growth.

According to further another aspect of the invention, the invention provides a method for manufacturing a vertical nitride semiconductor light emitting device including:

preparing a nitride single crystal substrate having a thickness of at least 100 μm, the nitride single crystal substrate including upper and lower regions along a thickness direction, the upper region doped with first conductive impurities at a concentration five times or greater than that of the lower region;

sequentially growing an active layer and a second conductive nitride semiconductor layer on the nitride single crystal substrate;

removing the lower region from the nitride single crystal substrate so that the upper region of the nitride single crystal substrate provides an underside surface; and forming a first electrode on the underside surface of the nitride single crystal substrate with the lower region removed therefrom and a second electrode on the second conductive nitride semiconductor layer.

Preferably, the step of sequentially growing the active layer and the second conductive nitride semiconductor layer includes growing the first conductive nitride semiconductor layer before growing the active layer. Preferably, the active layer and the second conductive nitride semiconductor layer are sequentially grown by Metal Organic Vapor Phase Epitaxy which beneficially ensures better crystallinity.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
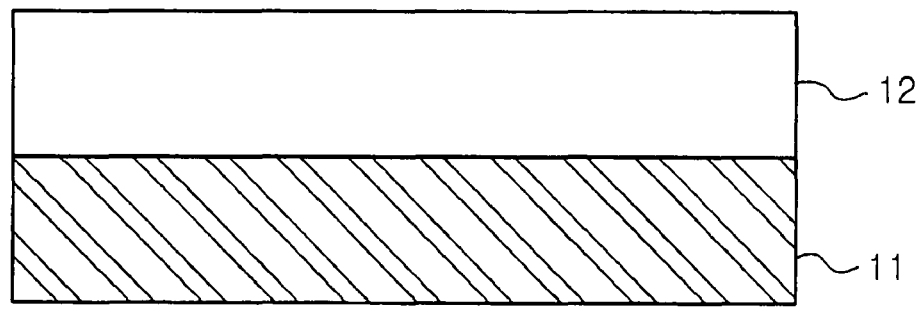
FIGS. 1a and 1b are cross-sectional views for explaining a method for manufacturing a conventional nitride single crystal substrate.
Figure 1:
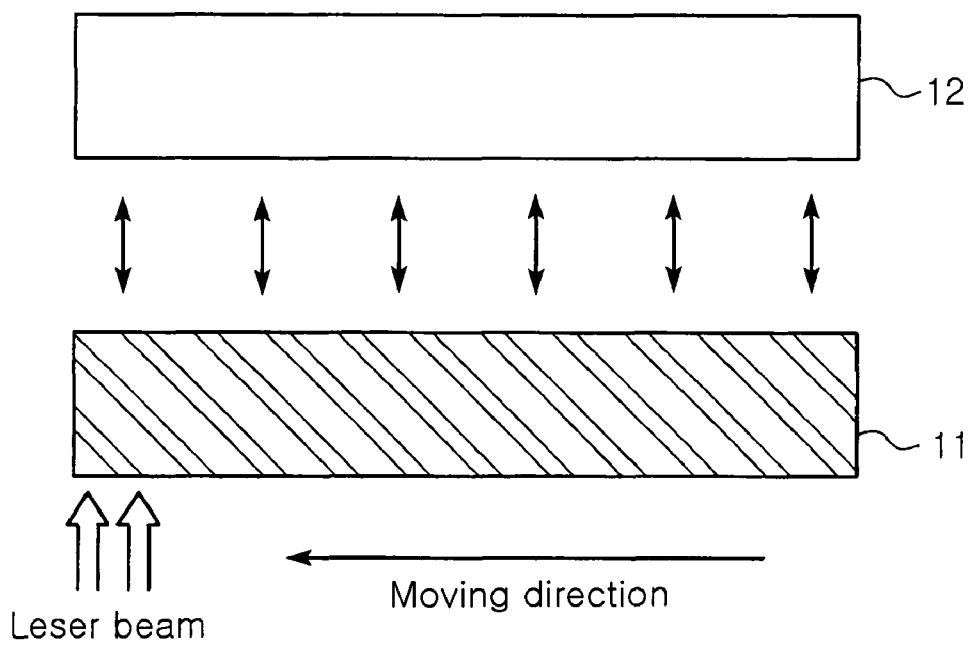
Figure 2:
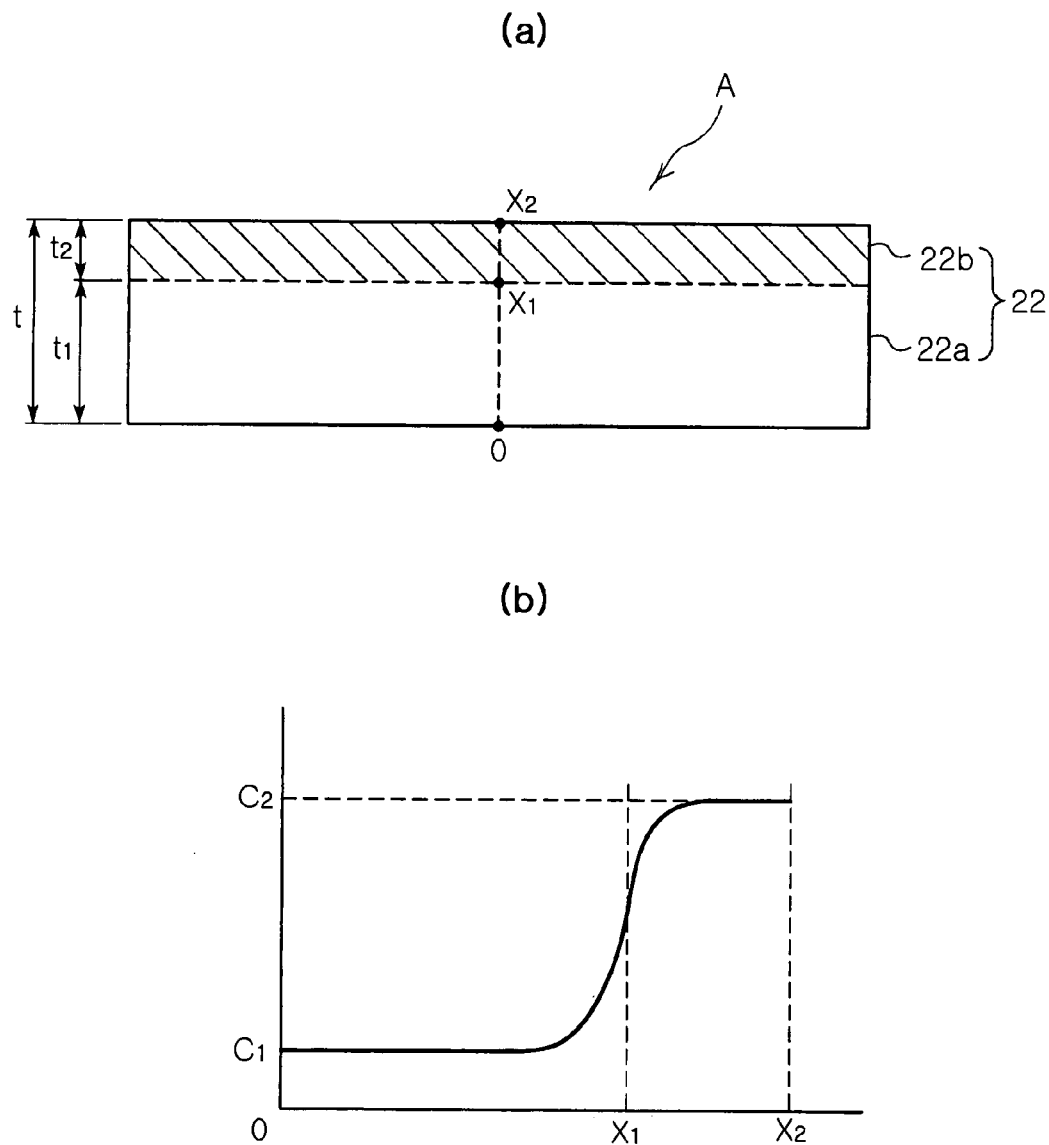
FIG. 2a is a side cross-sectional view illustrating a nitride single crystal substrate according to a first aspect of the invention.
FIG. 2b is a graph illustrating doping concentration of a nitride single crystal substrate in a thickness direction.

FIG. 2a is a side cross-sectional view illustrating a nitride single crystal substrate according to a first aspect of the invention.

As shown in FIG. 2a, the nitride single crystal substrate 22 of the invention includes upper and lower regions 22b and 22a along a thickness direction. The upper region 22b is highly doped and the lower region 22a is intentionally un-doped. The nitride single crystal substrate 22 is made of a material having a composition expressed by $Al_xIn_yGa_{(1-x-y)}N$, where $0 \leq x \leq 1$, $0 \leq y \leq 1$, and $0 \leq x+y \leq 1$. Here, the upper region 22b may have a composition identical to that of the lower region 22a. However, the upper region 22b has a doping concentration at least five times greater than that of the lower area 22a. The upper region 22b is doped to be sufficiently conductive. In contrast, the lower region 22b may be intentionally un-doped.

In this specification, an "intentionally un-doped region" is grown with no impurity sources injected intentionally. But this does not exclude those impurities which are unavoidably doped according to process environments.

FIG. 2b is a graph illustrating doping concentration in a thickness direction (0-X1-X2) of the nitride single crystal substrate of FIG. 2a. The lower region 22a has a doping concentration $C_1$ up to $5 \times 10^{17}/cm^3$ in view of a typical concentration level of intentional un-doping just described. Of course, this level is construed to include an ideal doping concentration of "0."

Preferably, the upper region 22b has a doping concentration $C_2$ of at least $5 \times 10^{18}/cm^3$ to guarantee sufficient conductivity. Typically, to fabricate a light emitting device, first, an n-type nitride layer is grown on a nitride single crystal substrate 22. Thus preferably, the upper region 22b is doped with an n-dopant such as Si.

Figure 3:
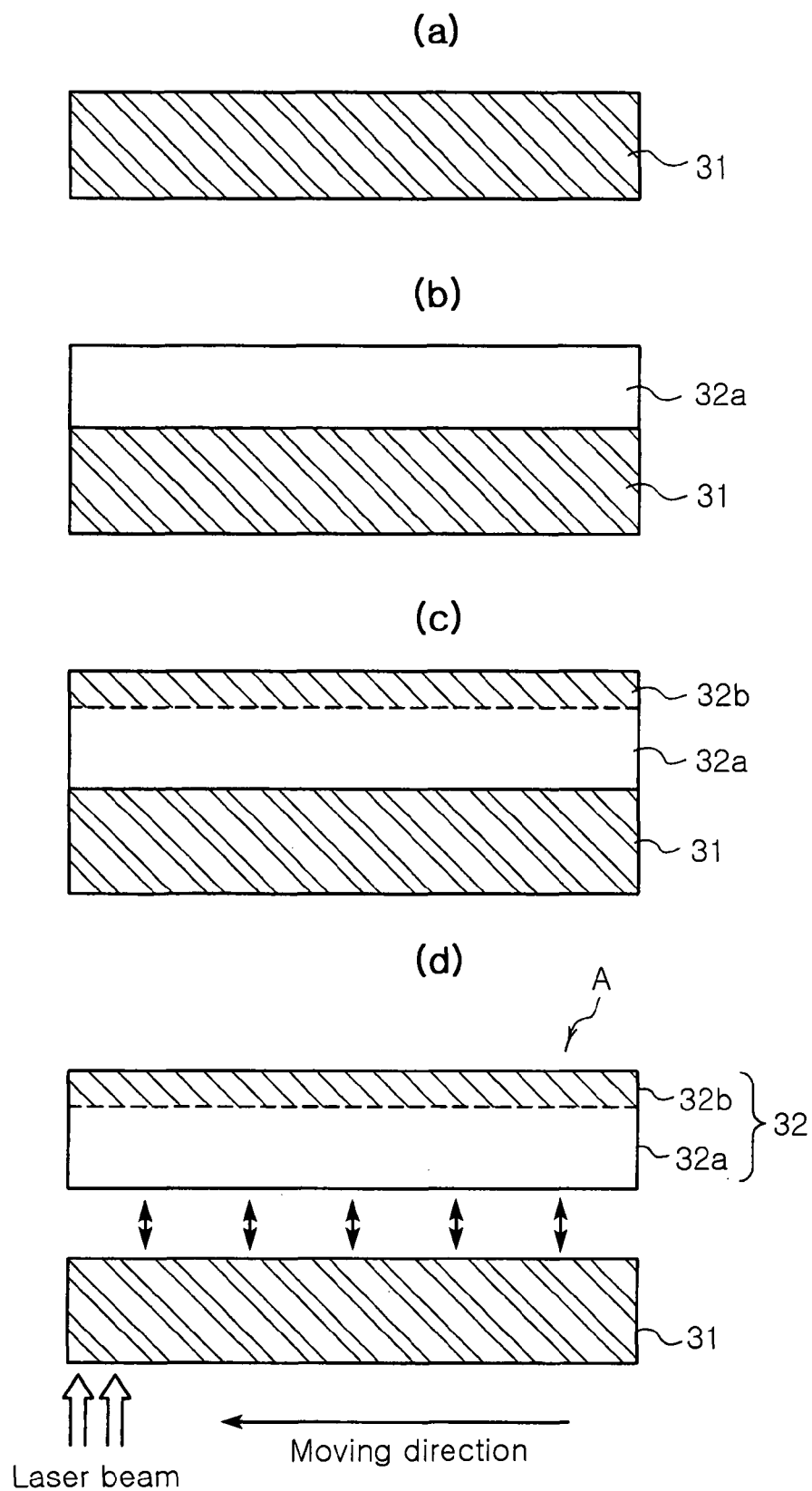
FIGS. 3a to 3d are cross-sectional views for explaining a method for manufacturing a single crystal substrate according to a second aspect of the invention.

Also, as shown, each of the upper and lower regions 22a and 22b has a doping concentration substantially identical in a thickness direction, but the doping concentration profile changes around an interface between the upper and lower regions 22a and 22b. To obtain this doping concentration as just described, the lower region 22a is grown with no impurities injected, and from a desired thickness, a certain amount of impurities are injected to grow the upper region 22b. This growth process will be explained in greater detail with reference to FIG. 3.

The lower region 22a of the substrate 22 according to the invention is very low in its doping concentration or intentionally un-doped to ensure superb crystallinity. Meanwhile, the upper region 22b is grown to exhibit sufficient conductivity resulting from excellent crystallinity of the lower region 22a. Thus, the substrate 22, when employed in manufacturing a vertical light emitting device, reduces thickness of the lower region 22a, i.e., a portion to be removed by lapping, thereby increasing process efficiency. Also, the remaining portion of the upper region 22b can be utilized as a part of a nitride light emitting device owing to its relatively superb crystallinity and sufficient conductivity.

In the nitride single crystal substrate 22, definition of the upper and lower regions 22b and 22a is not limited to the description as above. However, a typical top surface of the substrate has a crystal orientation of a c-axis and Ga polarity. Accordingly, the top surface A of the substrate 22 is defined by a region having a crystal orientation of c-axis and Ga polarity, by which the upper region 22b can be distinguished from the lower region 22a.

The nitride single crystal substrate 22 for general use has a thickness ranging from 200 μm to 600 μm. Here, preferably, the lower region 22a has a thickness t1 ranging from 100 μm to 500 μm. The lower region 22a with a thickness t1 less than 100 μm does not assure better crystallinity considering thickness of a typical substrate. The lower region 22a with a thickness exceeding 500 μm requires too long a lapping time for removing the lower region with low conductivity in fabricating the vertical light emitting device.

Preferably, the upper region 22b with sufficient conductivity has a thickness t2 ranging from 10 μm to 100 μm. The upper region 22b with a thickness t2 less than 10 μm does not yield satisfactory effects which can be accomplished by pre-formation of the high conductive area in the substrate. The upper region 22b with a thickness t2 exceeding 100 μm is degraded in crystallinity due to impurities present therein.

FIGS. 3a to 3d are cross-sectional views for explaining a method for manufacturing a nitride single crystal substrate according to a second aspect of the invention.

As shown in FIG. 3a, a substrate 31 is prepared to grow a nitride. The substrate 31 mainly adopts a sapphire substrate but may be made of one selected from a group consisting of SiC, Si, $MgAl_2O_4$, MgO, $LiAlO_2$ and $LiGaO_2$ Then, as shown in FIG. 3b, an intentionally undoped first nitride single crystal layer 32a is grown on the substrate 31. Preferably, the first nitride single crystal layer 32a along with a second nitride single crystal layer 32b which will be described later is grown by Hydride Vapor Phase Epitaxy (HVPE). The HVPE enables the nitride layer to be grown relatively fast. For example, in the HVPE, GaCl and $NH_3$ are supplied at an appropriate flow rate to react with each other, thereby growing GaN. This process is performed with no impurity source gas injected, thereby ensuring excellent crystallinity of the first nitride single crystal layer 32a.

Subsequently, as shown in FIG. 3c, a highly doped second nitride single crystal layer 32b is grown on the first nitride single crystal layer 32a. This process is performed under the same conditions as the one for growing the first nitride single crystal layer 32a as described above. But here, to obtain the highly-doped layer, an impurity source gas such as $SiH_4$, and $SiH_2Cl_2$ is supplied. Preferably, the second nitride single crystal layer 32b, as shown in FIG. 2a, is grown to a limited thickness. The second nitride single crystal layer 32b with excessive thickness inevitably degrades crystallinity due to impurities.

Then, as shown in FIG. 3d, a laser beam is irradiated from below the substrate 32 to separate the nitride single crystal substrate 32 including the first and second nitride single crystal layers 32a and 32b. In this process, metal element is separated from nitrides at an interface of the substrate 32 and melted. Here, a top surface of the single crystal substrate 32, i.e., a top surface of the second nitride single crystal layer 32b can have Ga polarity in the same manner as a typical nitride substrate.

The nitride single crystal substrate manufactured according to the invention can be thick enough to constitute a typical wafer due to the first nitride single crystal layer 32a with sufficient thickness even though the highly doped second nitride single crystal layer 32b is limited in its thickness. Moreover, the first nitride single crystal layer 32a is grown intentionally undoped, thereby exhibiting excellent crystallinity.

The nitride single crystal substrate according to the invention is considerably beneficial in fabricating a vertical light emitting device. Notably, the substrate is guaranteed with superior crystallinity and the upper region is doped to have sufficient conductivity. This significantly simplifies a lapping process for a substrate in fabricating a vertical light emitting device.

Figure 4:
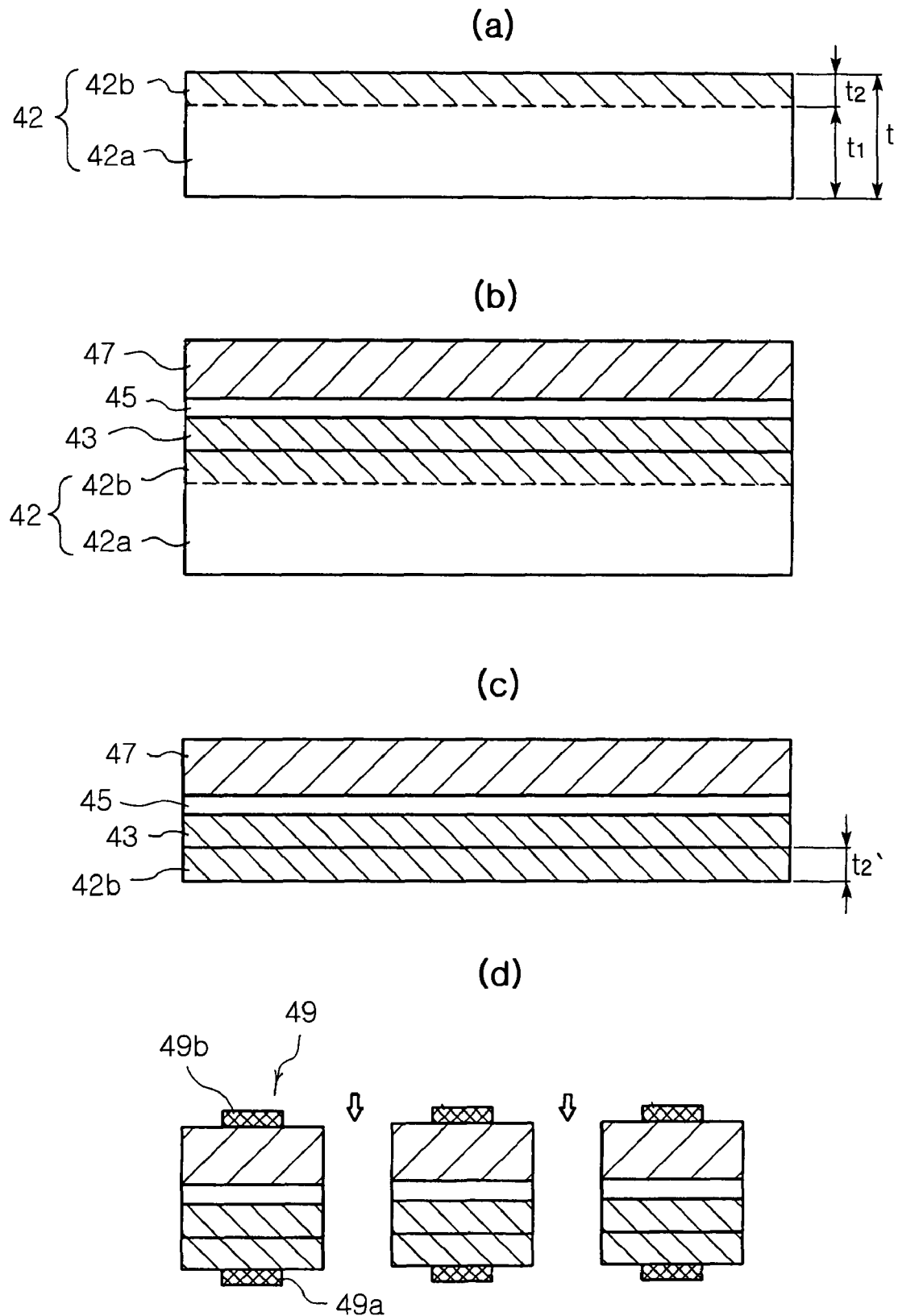
FIGS. 4a to 4d are cross-sectional views for explaining a method for manufacturing a vertical nitride light emitting device according to a third aspect of the invention.

FIGS. 4a and 4d are cross-sectional views for explaining a method for manufacturing a vertical nitride light emitting device according to a third aspect of the invention.

As shown in FIG. 4a, a nitride single crystal substrate 42 which includes upper and lower regions 42b and 42a along a thickness direction is prepared. The upper region 42b is highly doped and the lower region is low doped or intentionally undoped. As shown in FIG. 2a, the lower region 42a is intentionally undoped and has a doping concentration up to $5\times10^{17}/cm^3$. The upper region 42b is n-doped, preferably, to a concentration of at least $5\times10^{18}/cm^3$ to assure sufficient conductivity. Also, the nitride single crystal substrate 42 for general use may have a thickness t ranging from 200 μm to 600 μm. Here, preferably, the lower region 42a has a thickness t1 ranging from 100 μm to 500 μm. Preferably, the upper region 42b has a thickness t2 ranging from 10 μm to 100 μm.

As shown in FIG. 4b, an n-type nitride semiconductor layer 43, an active layer 45, and a p-type nitride semiconductor layer 47 are grown sequentially on the nitride single crystal substrate 42. Unlike a thick film process, this process is conducted by MOVP to obtain high-quality crystallinity. In this embodiment, the n-type nitride semiconductor layer 43 is deposited additionally but the invention is not limited thereto. However, as in this embodiment, preferably, the n-type nitride semiconductor layer 43 is grown additionally in an n-type area serving as the upper region 42b of the substrate 42. This improves growth conditions of the active layer 45 in light of a crystal growth plane. Furthermore, the n-type nitride semiconductor layer 43 is grown to a thickness $t_N$ smaller than the typical thickness considering the upper region which corresponds to the n-type nitride area.

Afterwards, as shown in FIG. 4c, the lower region 42a of the nitride single crystal substrate 42 is removed to expose the upper region 42b. The lower region 42a can be removed by performing lapping for an underside surface of the nitride single crystal substrate 42. Here, the exposed upper region 42b is sufficiently conductive as described, thereby realizing a vertical structure where electrodes are formed on opposed faces. What is more, the lapping process according to the invention can be significantly shortened compared to a case where the substrate is entirely removed. In this process, a thickness t2' of the remaining upper region 42b can be smaller than that t2 of the original upper region because it is preferable to grind the substrate to a thickness slightly greater than that of the lower region in order to expose merely a completely high conductive region.

Finally, as shown in FIG. 4d, p and n-electrodes 49a and 49b are formed on top and underside surfaces of the resultant structure, i.e., a top surface of the p-type nitride semiconductor layer 47 and an underside surface of the upper region 42b of the exposed nitride single crystal substrate 42, respectively. In this embodiment, electrodes are formed after a lapping process but formation of the p-electrode 49b may precede the lapping process. After forming these electrodes, the resultant structure is separated into each individual chip 40 by proper cutting.

As described above, to manufacture the vertical nitride light emitting device, a nitride single crystal substrate has an upper region highly doped to a limited concentration, and a lower region undoped, thereby guaranteed with superb crystallinity. This beneficially serves to manufacture the high-quality light emitting device. Also, the lapping process is conducted only on the lower region to produce a vertical structure, thereby shortening the process time.

As set forth above, according to exemplary embodiments of the invention, a nitride single crystal substrate includes a highly doped upper region and an undoped lower region. The undoped lower region enables better crystallinity of the substrate and the doped upper region is sufficiently conductive so that the nitride single crystal substrate can be usefully employed in manufacturing a vertical light emitting device.

While the present invention has been shown and described in connection with the preferred embodiments, it will be apparent to those skilled in the art that modifications and variations can be made without departing from the spirit and scope of the invention as defined by the appended claims.

What is claimed is:

1. A nitride single crystal substrate comprising:
upper and lower regions having the same composition and divided along a thickness direction, the upper and lower regions having a thickness of at least 100 μm,
wherein the upper region is grown on the lower region such that a top surface of the upper region has Ga Polarity, and the lower region has a thickness equal to or greater than that of the upper region, and wherein the lower region is un-doped and the upper region is n-doped such that the upper region has a doping concentration that is five times or greater than that of the lower region.

2. The nitride single crystal substrate according to claim 1, wherein the lower region has a first doping concentration substantially uniform in a thickness direction of the lower region and the upper region has a second doping concentration substantially uniform in a thickness direction of the upper region.

3. The nitride single crystal substrate according to claim 1, wherein the upper region has a doping concentration of at least $5 \times 10^{18}/cm^3$, and the lower region has a doping concentration up to $5 \times 10^{17}/cm^3$.

4. The nitride single crystal substrate according to claim 1, wherein the substrate has a thickness ranging from 200 μl to 600 μm.

5. The nitride single crystal substrate according to claim 4, wherein the lower region has a thickness ranging from 100 μm to 500 μm.

6. The nitride single crystal substrate according to claim 4, wherein the upper region has a thickness ranging from 10 μm to 100 μm.

7. The nitride single crystal substrate according to claim 1, wherein the nitride single crystal substrate comprises a material having a composition expressed by $Al_xIn_yGa_{(1-x-y)}N$, where $0 \leq x \leq 1$, $0 \leq y \leq 1$, and $0 \leq x+y \leq 1$.

* * * * *